United States Patent [19]

Knöchel

[11] Patent Number: 4,627,104
[45] Date of Patent: Dec. 2, 1986

[54] MIXER

[75] Inventor: Reinhard Knöchel, Kölln Reisiek, Fed. Rep. of Germany

[73] Assignee: U.S. Philips Corporation, New York, N.Y.

[21] Appl. No.: 603,053

[22] Filed: Apr. 23, 1984

[30] Foreign Application Priority Data

Apr. 30, 1983 [DE] Fed. Rep. of Germany ....... 3315860

[51] Int. Cl.$^4$ .............................................. H04B 1/26
[52] U.S. Cl. .................... 455/327; 455/328; 455/330
[58] Field of Search ............................. 455/325–328, 455/330

[56] References Cited

U.S. PATENT DOCUMENTS

| 3,678,395 | 7/1972 | Hunton et al. | 455/327 |
| 4,125,810 | 11/1978 | Pavio | 455/328 |
| 4,291,415 | 9/1981 | Buntschuh | 455/328 |
| 4,355,421 | 10/1982 | Seely | 455/327 |
| 4,430,758 | 2/1984 | Snyder | 455/327 |
| 4,485,488 | 11/1984 | Houdart | 455/327 |
| 4,516,271 | 5/1985 | Fraise | 455/327 |
| 4,541,124 | 9/1985 | Lacour et al. | 455/330 |
| 4,542,535 | 9/1985 | Bates et al. | 455/327 |

FOREIGN PATENT DOCUMENTS

| 58-83308 | 6/1980 | Japan | 455/327 |
| 56-30304 | 3/1981 | Japan | 455/327 |
| 2104750 | 3/1983 | United Kingdom | 455/327 |

OTHER PUBLICATIONS

"A Subharmonically Pumped Fin-Lin Mixer", Begemann, 6/81 All.
"Simple Balun-Coupled Mixer", Hallford, 6/81, All.
"Ku Band Front-End Integrated Fin-Line Technique", Kurzberichte, 1980, All.
"The Application of Integrated Circuit to Microwave Receivers", 9/73, All, Oxely.

Primary Examiner—Jin F. Ng
Assistant Examiner—Curtis Kuntz
Attorney, Agent, or Firm—Robert J. Kraus

[57] ABSTRACT

A mixer including a plurality of mixer diodes arranged at a junction formed by first, second and third waveguides. The first waveguide is a slot transmission line including spaced-apart conductive layers on each of the opposite sides of a dielectric substrate. The second waveguide is a coplanar transmission line including spaced-apart conductive layers and a central conductive layer on each side of the substrate. The third waveguide is a parallel plate transmission line including extended portions of the central conductive layers, which extend toward the slot in the first waveguide. The diodes electrically connect the extended portion of the central conductive layers to the spaced-apart conductive layers of the first waveguide.

21 Claims, 7 Drawing Figures

MIXER

BACKGROUND OF THE INVENTION

The invention relates to a mixer, particularly for use in the microwave and millimetre wave ranges, comprising four two-pole mixing elements which in essence form a ring and are arranged in the region of a junction between at least two wave guides. The first wave guide comprises a slotted line structure and the second waveguide comprises a line structure formed by at least a central line portion and outer line portions arranged around this central portion. At least the line portions of the first wave guide and the central line portion of the second wave guide are provided as layers on the upper surface of a laminar substrate made of a dielectric material.

U.S. Pat. No. 3,678,395 discloses a mixer in four mixer diodes which are arranged so as to form a ring at the junction of a slot-line and a coplanar line extending axially thereto. High-frequency electromagnetic waves are applied to the diodes via the slot-line and the coplanar line. The electromagnetic oscillations formed as mixing products of these waves at the diodes are derived from the diodes via a shunting network formed by inductive lines and capacitors and a transformer network and are applied to the intermediate-frequency output as an intermediate frequency signal.

The prior art mixer has the disadvantage that, in addition to the slot line and the coplanar line complicated components for deriving the mixed products from the intermediate frequency output are required. These components such as wires, capacitors or transformer networks are connected to the lines during the production of the mixer in separate operation processes, for example by soldering, and are consequently the cause of high production costs. Moreover, such circuit components limit the frequency range for the electromagnetic waves applied to the mixer; more specifically the frequency range for the mixed products is significantly limited towards the high frequencies. In addition, at least some of additional circuit elements are difficult to reproduce in actual production, so that large spreads in the electrical properties may occur between individual mixers. Mixers of the above-described construction are also rather delicate and sensitive to mechanical load.

SUMMARY OF THE INVENTION

It is an object of the invention to provide a mixer which is of a simple and rugged construction and can be produced at low cost with a satisfactory reproducibility of its electrical properties. A further object of the invention is to provide a mixer for a wide frequency range.

According to the invention, this object is accomplished for a planar mixer of the type set forth in the opening paragraph in that the bottom side of the substrate is provided with conductive layers which substantially correspond to the layers on the upper side and are arranged substantially congruently therewith. Each of the two waveguides also incorporate layers at the bottom side of the substrate which are arranged congruently with the layers on the upper side: A third waveguide is formed from the conductive layers which form the central line portions of the second waveguide and two of the mixer elements are so provided on each side of the substrate that they connect one of the central conductive layers to one of the portions of the remaining layers.

The invention is based on the recognition that a mixer can be constructed such that the mixing elements are arranged at the junctions between three waveguides. The electromagnet waves applied to the three waveguides then evidence predominantly "orthogonal" field patterns, which means that at the junctions of the waveguides without the mixing elements predominantly no propagation of the electromagnetic waves from one waveguide to the other occurs. For waves which are incident on the waveguides in the direction of the junctions these junctions form in essence a sink. Consequently, in essence no additional decoupling or filtering networks for separating the waves propagating along the individual waveguides are required. The mixer elements may also be arranged close to each other.

The said orthogonality of the field patterns holds with one restriction: the wave travelling along the first, slotted waveguide to the junction between the first and second waveguides can also be propagated as a special waveform along the second waveguide. This coupling of the wave from the first waveguide to the second waveguide renders it possible on the one hand to connect the mixing elements optionally either to the portions of the conductive layers of the first waveguide or to the external portions of the conductive layers of the second waveguide depending on which embodiment is most advantageous as regards the space occupied. On the other hand it is obvious that the propagation of the waveform overcoupled from the first waveguide to the second waveguide can be prevented by means of very simple measures which will be described in greater detail hereinafter.

The mixer according to the invention has consequently the advantage that it is of a very simple, compact, light-weight and rugged construction. The line structures can be produced in a simple way, for example by means of photolithographic processes, and can be reproduced with a very high degree of accuracy. Only the mixing elements are then secured in a simple way to this line structure, for example by means of soldering. To obtain a ring with a symmetrical arrangement of the mixing elements two mixing elements are always provided on each face of the substrate. More specifically, the mixing elements connect on each face of the substrate always the central layer of the second waveguide to the portions of the conductive layers of the first waveguide present on both sides of the slot. The ring formed by the mixing elements is closed via the capacitances between the conductive layers opposite to each other on both faces of the substrate, particularly those of the first waveguide.

According to an advantageous embodiment of the invention, the conductive layer portions constituting the line portions of the first waveguide and the outermost portions of the conductive layers of the second waveguide, which portions are arranged adjacently on always the same face of the dielectric substrate, consist of one piece. This results in a simple configuration of the waveguide and a good electrical connection of the contiguous portions of the waveguide. It is alternatively possible for the said layers to pass into each other without changes in their dimensions transversely to the direction of propagation of the waves. The second waveguide differs from the first waveguide only in that intermediate conductive layers are provided between the outer portions of the conductive layers. The distances between individual portions of the conductive layers of a waveguide on always one face of the substrate, which distances must be fixed accurately, are determined by the required wave resistances of the waveguides.

In accordance with an advantageous development of the invention the dielectric material substrate is provided in an electrically conducting casing. As a result thereof the mixer is protected from electromagnetic interferences and is given a mechanically more stable construction.

In accordance with a further development of the invention the first waveguide is in the form of a slot or fin line and the second waveguide is in the form of a coplanar line. The third waveguide is in the form of a parallel plate line. These three waveguide configurations can be formed ina simple way from conductive layers of a plate-shaped dielectric substrate. The said allocation of the three waveguide types to the first, second and third waveguides results in a particularly simple and compact implementation of the junctions between the three waveguides, in which each waveguide is decoupled from the other waveguide. In addition, the said choice of waveguide types renders a particularly simple arrangement of the mixing elements possible.

In accordance with another embodiment of the invention the second waveguide is connected for the conduction of high frequency signals to a first rectangular hollow waveguide in such manner that the second waveguide is inserted as an entry in the hollow waveguide centre plane which extends parallel to the smaller cross-section. Such an arrangement provides a simple and efficient, that is to say low-reflection coupling between the second waveguide and the first rectangular hollow waveguide, more specifically as regards its dominant wave, the rectangular hollow waveguide enabling the supply and discharge of waves with a low degree of attenuation. In addition, the said arrangement prevents the above-mentioned waveform which was overcoupled from the first waveguide to the second waveguide from being propagated to the second waveguide. In the first rectangular hollow waveguide the said waveform is not capable of propagation. The propagation of the said waveform would, for example, also be prevented by conduction from a second waveguide to a coaxial line, as is known from the prior art.

In accordance with an advantageous further development of the invention the third waveguide comprises a cut-off filter at that side of the hollow waveguide which faces away from the mixing elements. In the above described arrangement the field lines of the waves propagating to the third waveguide extend perpendicularly to the field lines of the hollow waveguide waves, which accomplishes an adequate decoupling between the waves on the third waveguide and the hollow waveguide. As the line portions of the waveguide are at the same time portions of the second waveguide to which the waves from the hollow waveguide are overcoupled, a cut-off filter is provided on that side of the hollow waveguide which faces away from the mixing elements at the second or third waveguide, respectively, which filter prevents the energy of the rectangular hollow waveguide from being conducted into a direction different from the direction towards the mixing elements.

In a further embodiment of the invention the cut-off filter is formed by a section of a coplanar line arrangement formed from conductive layers on the dielectric substrate. Such a filter can be reproducibly manufactured in a simple way and with a high degree of accuracy and has a high stop-band attenuation.

In accordance with an advantageous further development of the invention the parallel-plate line is transferred to an asymmetrical strip-line by widening one of its conductors. This results in a low-reflection and low-attenuation conversion of the symmetrical wave types of the parallel plate line into asymmetrical wave types of the asymmetrical strip lines and vice versa.

In accordance with a still further implementation of the invention the parallel plate line is connected to a coaxial line via the asymmetrical strip line in such manner that the non-widened conductor is connected to the central conductor of the coaxial line and the widened conductor is connected to the outer conductor of the coaxial line. Such a transition to or from a coaxial line can be produced in a simple way and is poor in reflection. In connection with the said transition between the parallel plate line and the asymmetrical strip line a simple and reflection-poor coupling or outcoupling device of the mixer according to the invention to a coaxial line and vice versa is obtained.

In accordance with a further embodiment of the invention the casing is divided along the plane of the dielectric substrate and the substrate is secured between the portions of the casing by clamping. This embodiment of the casing allows a simple, accurate and mechanically stable mounting of the dielectric substrate in the casing and also a simple and reliable electric contact between the casing in at least a portion of the conductive layers on the dielectric substrate.

In accordance with a further development of the invention the first waveguide is connected in a junction formed by widening the slots between the portions of the conductive layers to a second rectangular hollow waveguide and the casing is in the form of a rectangular hollow waveguide, at least in the region of this junction. This provides a simple and low-reflection transition from the slot or fin-line to a rectangular hollow waveguide.

In accordance with an other embodiment of the invention the parallel plate line is connected in a junction which is of the type of an anti-podal slot or fin-line having a widening intermediate space between the conductive layers, to a third rectangular hollow waveguide and the casing is in the form of a rectangular hollow wave guide, at least in the region of this junction. By such a junction, which can be produced in a simple and accurate way the wave on the parallel plate line is first converted into a wave on a slot or fin-line and from there into a rectangular hollow waveguide wave. This accomplishes a low-attenuation and low-reflection coupling between the parallel plate line and the rectangular hollow waveguide.

In accordance with a further development of the invention, portions of the conductive layers provided along both sides of the edges of the dielectric substrate bordering on the casing are electrically interconnected by the casing. This ensures a low-inductance connection between the said conductive layers which moreover is simple and reliable.

In accordance with another development of the invention, at least some of the portions of the conductive layers provided along both sides of the dielectric substrate edges bordering on the casing are electrically insulated from the casing and provided with conductive which are insulated from the casing and all the further portions of the conductive layers to apply a d.c. biasing voltage to one or several of the mixing elements. It is consequently possible to change the operating points of the mixing elements by the choice of the d.c. biasing voltages and consequently to adjust the properties of the mixers as regards the generation of mixed products. Such an insulation does not affect the high-frequency signals as with an adequately thin dielectric substrate and adequately large surface areas of the conductive layers the capacitance between these layers is absolutely sufficient for overcoupling the high-frequency signals.

In accordance with another further development of the invention the conductors of the parallel plate line are interrupted and the points of interruptions are shunted by coupling capacitances to keep the d.c. biasing voltage removed from the waveguide connected to the parallel plate line. The d.c. biasing voltage of the mixing elements is thus efficiently kept far from other microwave circuits connected to the mixer, in which circuits they might be short-circuited or cause damage. Conduction of the high frequency signals is ensured without any limitation by the coupling capacitances.

In accordance with an advantageous embodiment of the invention the mixing elements have a non-linear effective resistance. Mixing elements of such a type are used more specifically when the frequency of the mixed products is less than the frequency of the receiving signal to be converted, that is to say by down-mixing mixers.

In accordance with another embodiment of the invention the mixing elements have a non-linear reactance. Mixing elements of this type are preferably used when the frequency of the mixed products is higher than the frequency of the receiving signals to be converted, that is to say for up-mixing mixers.

In accordance with an advantageous development of the invention the mixing elements are in the form of diodes. Diodes are of a simple construction, have a high non-linearity and optionally a non-linear effective resistance or reactance for different embodiments and polarities of the d.c. biasing voltage. They enable a high efficiency in the conversion of the high-frequency signals.

In accordance with a still further development of the invention the mixing elements receive via the first waveguide a receiving signal whose frequency is to be converted and via the second waveguide a pumping signal and via an intermediate frequency signal formed in the mixing elements is taken from the mixing elements the third waveguide. Particularly in the case of a down-mixing mixer this accomplishes a particularly advantageous matching of the waveguide to the frequency of the transmitted waves. It is, however, alternatively possible to effect feeding or discharging of the said signals with a different mode of allocation of the waveguides.

In accordance with another embodiment of the invention the mixing elements and optionally the coupling capacitances are beam-lead components. Such components have low parasitic capacitances and inductances and should therefore be preferred for high frequencies and braod-band circuits.

In accordance with a further embodiment of the invention two mixing elements connect the centre layer on the upper surface of the substrate to one of the portions of the layers of the first waveguide on the upper surface and two further mixing elements connect the centre layer at the bottom side of the substrate to one of the portions of the layers of the first waveguide at the bottom side directly at the junction of the waveguide. In this embodiment a very compact arrangement of the mixing elements is obtained.

BRIEF DESCRIPTION OF THE DRAWING

The invention will now be described in greater detail by way of example with reference to the embodiments shown in the accompanying drawing, in which.

DESCRIPTION OF THE PREFERRED EMBODIMENTS

Figure 1:
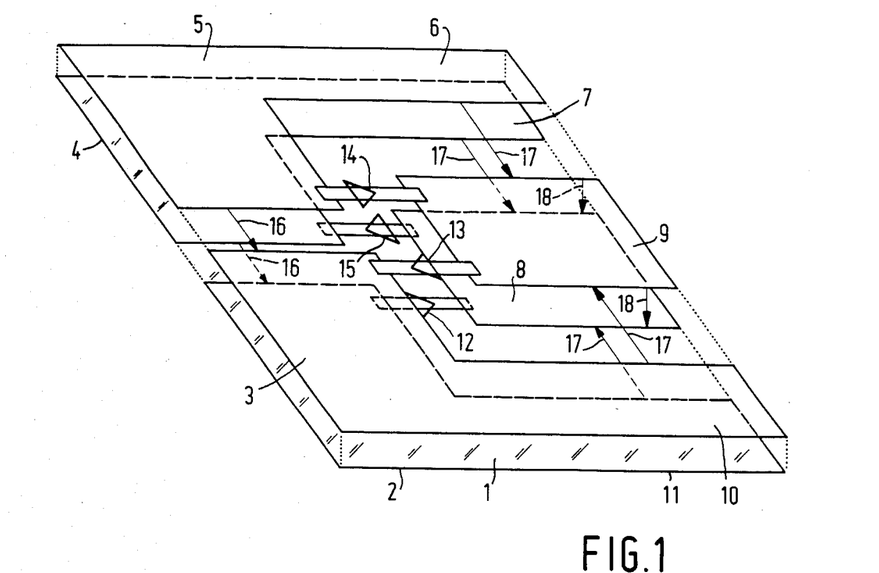
FIG. 1 shows an embodiment of a dielectric substrate having a junction between three waveguides according to the invention.

FIG. 1 shows a section of a laminar dielectric substrate 1, which is provided on both sides with portions 2 to 11 of conductive layers. A first waveguide is formed by two portions 3, 5 of the layers which are provided on the upper surface of the substrate 1 and are separated from each other by a slot and also by portions 2, 4 of the layers which are congruently provided on the bottom side of the substrate 1. The electric field of an electromagnetic wave propagating to the first waveguide extends in essence in the slots between the portions 3, 5 of the layers on the upper surface and 2, 4 at the bottom side and is indicated by means of arrows 16. Consequently, the first waveguide is in the form of a slot or fin-line provided on both faces of the substrate 1.

In the axial direction a second waveguide which is formed by central layers 8, 9 which are congruently applied on top of each other on the top and bottom sides of the substrate 1 and outer portions 6, 7, 10, 11 of the layers is connected at a junction to this first waveguide. The second waveguide is in the form of a coplanar waveform provided on both surfaces of the substrate 1 and whose centre axis coincides with the centre axis of the first waveguide. The outer portions 6, 10 of the layers on the upper surface are formed in one piece with the adjacent portions 3, 5 of the layers of the first waveguide; this also holds for the portions of the layers at the bottom side. The electric field of the electromagnetic wave propagating along the second waveguide always extends from one of the outer portions 6, 7, 10, 11 of the layers to the central layer 8, 9 applied on the same face of the substrate 1 and indicated by arrows 17.

A third waveguide is formed by the central layers 8, 9 of the second waveguide and is in the form of a parallel plate line. The central layers 8, 9 are electrically separated from the other layers. The third waveguide carries a wave whose electric field is in essence perpendicular to the widened portion of the layer 8, 9 and which is indicated by the arrows 18.

Four mixing elements 12 to 15, which in the resent embodiment are in the form of semiconductor diodes, are arranged at the junctions of the three waveguides 2 to 5, 6 to 11, 8 and 9. Arrows in FIG. 1 indicate a possible polarity of the diodes. Two diodes 13, 14 are located on the upper surface of the dielectric substrate 1, two further diodes 12, 15 are located on the bottom side. Each of the diodes 12 to 15 connects one of the intermediate layers 8, 9 to one of the portions 2 to 5 of the conductive layers of the first waveguide. The diodes 12 to 15 may be arranged such that they connect one of the intermediate layers 8, 9 to one of the outer portions 6, 7, 10, 11 of the layers of the second waveguide. The conducting layers 2 to 11 of the three waveguides are, for example, formed by means of a photolithographic process from metal-plated layers applied on both sides of the dielectric substrate 1. The diodes are in the form of beam-lead modules and are soldered directly to the conductive layers 2 to 5, 8, 9.

A receiving signal whose frequency is to be converted is applied to the mixing elements via the first waveguide whilst the mixing elements further receive a pumping signal via the second waveguide. An intermediate freuency signal formed in the mixing element as a mixed product of these signals is taken from the mixing elements via the third waveguide.

In the arrangement shown in FIG. 1 overcoupling the waves from the second or third waveguides to an other waveguide is only possible via the diodes 12 to 15. Of the waves incident on the first waveguide identical portions are overcoupled to the slots formed by the portions of the conductive layers 6, 7 and 8, 9 on the one hand and 8, 9 and 10, 11 on the other hand. The waveguide which as a result thereof propagates along the second waveguide has an electric field which between the layers 6, 7 and 8, 9 has in essence the direction shown by the arrows 17 and between the layers 8, 9 and 10, 11 in essence a direction opposite to the direction shown by the arrows 17. The diodes 12 to 15 may be arranged close to each other so that the different high frequency currents produced by the individual waves flow without or substantially without delays. As a result thereof the present arrangement has in operation a wide bandwidth.

The currents assigned to the intermediate frequency signal and flowing int he third waveguide 8, 9 are conveyed via the capacitances between the conductive layers 2 and 3 or 4 and 5, respectively. As the dielectic substrate is very thin, for example 0.254 mm, and the layers 2 to 5 have adequately large surface areas, the said capacitances have a value of several times 10 pF so that the high frequency currents can flow without obstacles. At very low frequency mixed products the current path can be led via a casing, not shown in FIG. 1, in which the dielectric substrate is provided and which electrically interconnects the conductive layers 2 and 3 or 4 and 5 respectively.

The choice of the width of the slots between the layers and the width of the conductor portions 8 and 9 of the third waveguide enable such an adjustment of the wave resistances of the three waveguides, independent from each other, that the waveguides are terminated in a reflectionfree manner at the junctions. To improve matching, the individual conductive layers 2 to 11 may in addition be provided with recesses of different types, with which more specifically capacitances, inductances and resonant circuits can be imitated in known manner without additional production cost.

Figure 2:
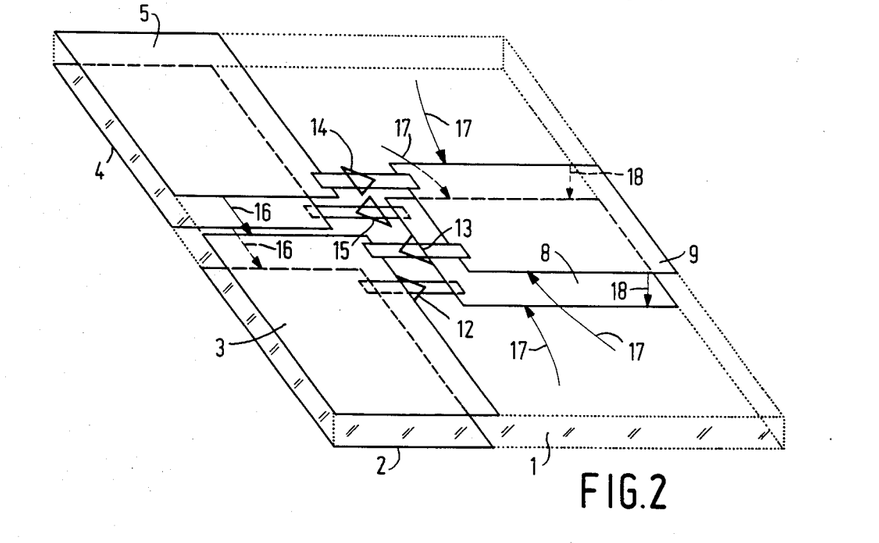
FIG. 2 shows another embodiment of a junction of waveguides according to the invention.

FIG. 2 shows a modification of the embodiment of the invention shown in FIG. 1. Components corresponding to those shown in FIG. 1 are given the same reference numerals. The conductor arrangement of FIG. 2 is also contained in an electrically conducting casing, not shown. It differs in essence from the arrangement shown in FIG. 1 in that the outermost conductor portions of the second waveguides are formed directly by the wall of the casing, so the portions 6, 7, 10, 11 of the layers are absent. The arrows 17 denote the electric field of the waves along the second waveguide between the casing and the conductive layers 8, 9. The arrangements shown in FIGS. 1 and 2 have in common that the conductive layers on the top and bottom sides of the dielectric substrate have the same dimensions and are accurately in registration. Such a symmetrical structure accomplishes that the described mixer can also be used at very high frequencies.

Figure 3:
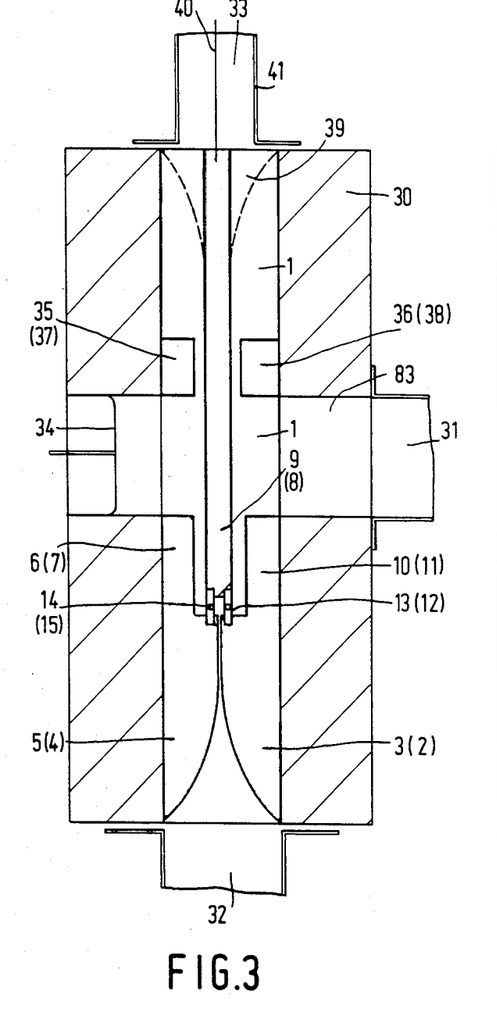
FIG. 3 shows a further embodiment of the mixer according to the invention in a cross-sectional view through the plane of the dielectric substrate.

FIG. 3 is a schematical representation of a cross-sectional view through the casing 30 of an embodiment for a mixer according to the invention with a top view of the dielectric substrate 1 provided in the casing 30. The layer portions 3, 5, 6, 9, 10 which can be recognized in the top view are shown cross-hatches; in registration therewith the portions 2, 4, 7, 8, 11 of the layers are present at the bottom side of the dielectric substrate 1. In addition, the mixer diodes 13, 14 are shown; the mixer diodes 12, 15 are located in registration therewith at the bottom side of the dielectric substrate. The conductive layers have the shape shown in FIG. 1.

The casing is in the form of two cross-wise hollow waveguide structures of preferably rectangular cross-sections, the dielectric substrate being arranged in the longitudinal centre planes which are in parallel with the narrow cross-sectional dimensions of the rectangular hollow waveguide sections. The casing 30 is connected to a first rectangular hollow waveguide 31 and to a second rectangular hollow waveguide 32 and also to a coaxial line 33.

The receiving signal to be convereted is coupled via the second rectangular hollow waveguide 32 to the first waveguide and is consequently applied to the mixing elements. To provide a low-reflection junction between the second rectangular hollow waveguide and the first waveguide the conducting layers 2 to 5 are gradually tapered such to narrower dimensions at their ends facing the second rectangular hollow waveguide that the slots between the layers are symmetrically flared to the full heights of the second rectangular hollow waveguide 32. In the region between the second rectangular hollow waveguide 32 and the junction of the waveguides the casing 30 is in the form of a rectangular hollow waveguide having the same dimensions as the second rectangular hollow waveguide 32.

A pumping signal is applied to the mixer via the first rectangular hollow waveguide 31. This signal is coupled from the rectangular hollow waveguide 31 into a hollow waveguide section 83, whose cross-sectional dimensions are identical to those of the first rectangular hollow waveguide 31 and is also inserted into the casing 30. The hollow waveguide section 83 is terminated at that end which faces away from the first rectangular hollow waveguide 31 by a short-circuiting plunger. The dielectric substrate 1 is passed such through the centre plane of the hollow waveguide section 83, which plane extends in parallel with the narrow portion, that the conductive layers 8, 9 of the second or third waveguides, respectively form a coupling rod for coupling electromagnetic waves from the hollow waveguide section 83 into the second waveguide. The choice of the dimensions of the second waveguide, that is to say its length and its wave resistance, and also the tuning of the short circuit by means of the short-circuiting plunger 34 accomplishes a low-reflection coupling of the pumping signal from the first rectangular hollow waveguide 31 into the second waveguide. The waveform resulting from the overcoupling from the first waveguide to the second waveguide is not coupled by the described coupling rod into the first rectangular hollow waveguide 31 and does not propagate further along the third waveguide. As a result thereof the first and second rectangular hollow waveguides 31, 32 and the coaxial line 33 are decoupled from each other.

A cut-off filter from which a transmission of the pumping signal in the direction to the coaxial line is prevented is arranged adjacent that side of the hollow waveguide section 83 which faces away from the second waveguide. This cut-off filter is formed by, for example, two conductive layers 35, 36 at the upper and the layers 37 and 38 at the bottom side of the dielectric substrate 1, which are in registration with the layers on the upper side. Together with the layers 8, 9 the conductive layers 35 to 38 form, for example, a coplanar line similar to the second waveguide whose length in the direction of propagation corresponds to one quarter of the wavelength of the pumping signal and which looses its energy at the end. Thus, an apparent short circuit is produced for the pumping signal in the region of the side wall of the hollow waveguide section 83. It is, however, alternatively possible to produce without additional production cost cut-off filters having a plurality of circuits, that is to say having conductive layers 35 to 38 which are subdivided in a plurality of sections of different widths. It is alternatively possible to provide a cut-off filter in that position by providing the casing 30 with projected portions whose cross-sections are given the shape of the conductive layers 35 to 38.

If the junction between the three waveguides in the mixer shown in FIG. 3 is formed in the manner shown in FIG. 2, it is alternatively possible to position the mixing elements 12 to 15 closer to the hollow waveguide section 83 in such manner that the second waveguide becomes shorter. In limit cases the mixing elements 12 to 15 are located directly in the region of the wall of the hollow waveguide section 83. This accomplishes a particularly compact construction for the mixer according to the invention. Forming the second waveguide as a coplanar line as shown in FIGS. 1 and 3 provides, in contrast therewith, an additional possibility for matching the wave resistances.

Behind the cut-off filter 35 to 38 the third waveguide is gradually transferred to an asymmetrical strip line by gradually widening the end section 39 of the conductive layer 9 at the bottom side of the dielectric substrate. The coaxial line 33 is so connected to this asymmetrical strip line that its inner conductor 40 is connected to the conductive layer 8 on the upper surface of the dielectric substrate 1 and its outer conductor 41 to the end section 39. A transition of this type from the third waveguide to the coaxial line is of a particularly broad-band nature.

If instead of the coaxial line 33 a hollow waveguide is used to derive the intermediate frequency signal, which is advantageous for high intermediate frequencies, a section of an anti-podal fin-line which has in the direction towards the hollow waveguide a gradually widening slot between the conducting layers is added to the third waveguide instead of the junction shown. Such junctions are known from literature.

Figure 4:
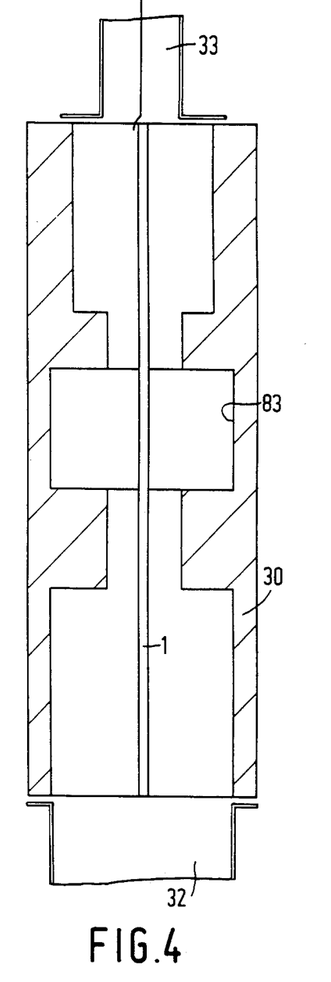
FIG. 4 shows a longitudinal section through the arrangement of FIG. 3 perpendicularly to the plane of the dielectric substrate.

FIG. 4 shows a longitudinal section through the mixer of FIG. 3, perpendicularly to the plane of the dielectric substrate. This Figure clearly shows the division of the casing 30 into a plurality of rectangular hollow waveguide sections with in essence equal heights and different widths.

Figure 5:
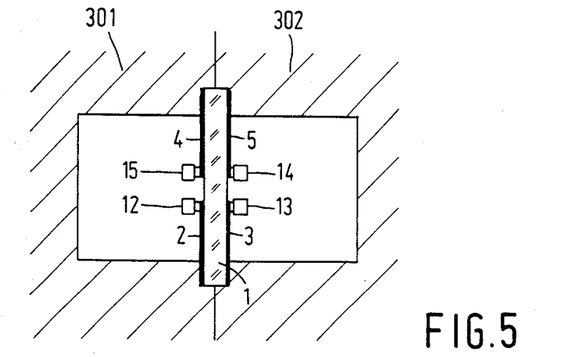
FIG. 5 shows a cross-sectional view along the longitudinal center axis of the waveguide of an emobdiment of the mixer according to the invention, in the region of the mixing elements.

FIG. 5 is a cross-sectional view through a mixer of FIG. 3 near the mixing elements. The casing 30 is formed by two halves 301 and 302, between which the dielectric substrate 1 is secured by clamping. In this situation the conductive layers 2, 4 are electrically connected to one half 301 of the casing and the conductive layers 3, 5 to the other half 302 of the casing. Via the metal contact between the casing halves 301, 302 the conductive layers on both sides of the dielectric substrate 1 are then electrically connected at their edges.

In the region of the first waveguide the cross-sectional dimensions of the casing are preferably adapted to those of the second hollow waveguide which as a rule has standardized measures, to keep reflections to a minimum. For the propagation of the wave along the first waveguide the dimensions of the casing are of secondary importance as the wave is predominantly propagated in the slots between the conductive layers 3 and 5 or 2 and 4, respectively. In the region of the third waveguide the casing is dimensioned in known manner similar to the casing for a strip line circuit.

Figure 6:
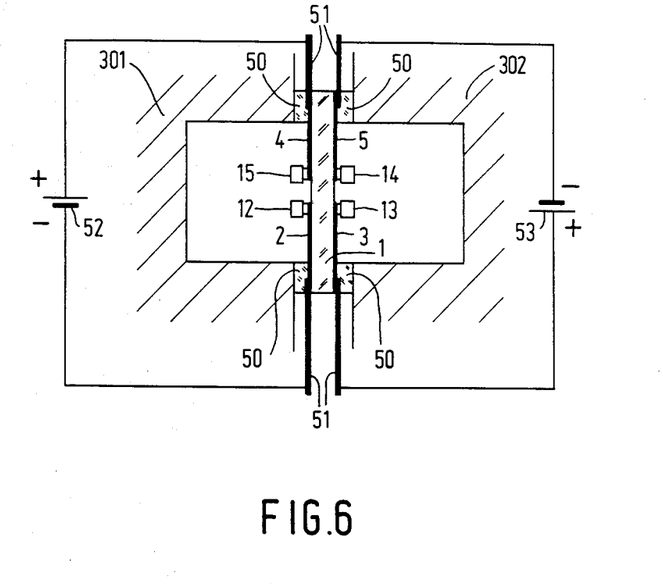
FIG. 6 shows a further embodiment of a mixer according to the invention as shown in FIG. 5.

FIG. 6 shows a cross-sectional view of a mixer in accordance with a further embodiment of the invention, in which in contrast in FIG. 5 the casing halves 301, 302 are d.c. isolated from each other. Insulating pieces 50 are inserted between the casing halves 301, 302 and the dielectric substrate, which pieces also provide d.c. isolation between the conductive layers 2 to 5 and the casing halves 301, 302. Contacts 51 which are connected to d.c. voltage sources 52, 53 are fixed by clamping between the insulating pieces 50 and the conductive layers 2 to 5. In this way different d.c. biasing voltages can be applied to the mixing elements 12 to 15, the insulating pieces 50 preventing the voltage sources 52, 53 from being short-circuited via the casing halves 301, 302. The voltage sources 52, 53 have for their object to shift the operating point on the non-linear current-voltage characteristics of the mixing elements 12 to 15. As a result thereof, more specifically when low-power pumping signals are used, the efficiency of the mixer can be improved. The insulated pieces 50 exercise no influence on the high-frequency signals, only the propagation of very-low frequency intermediate frequency signals may be impeded. The FIGS. 5 and 6 further show clearly how the mixing elements 12 to 15 are provided on both sides of the dielectric substrate 1.

Figure 7:
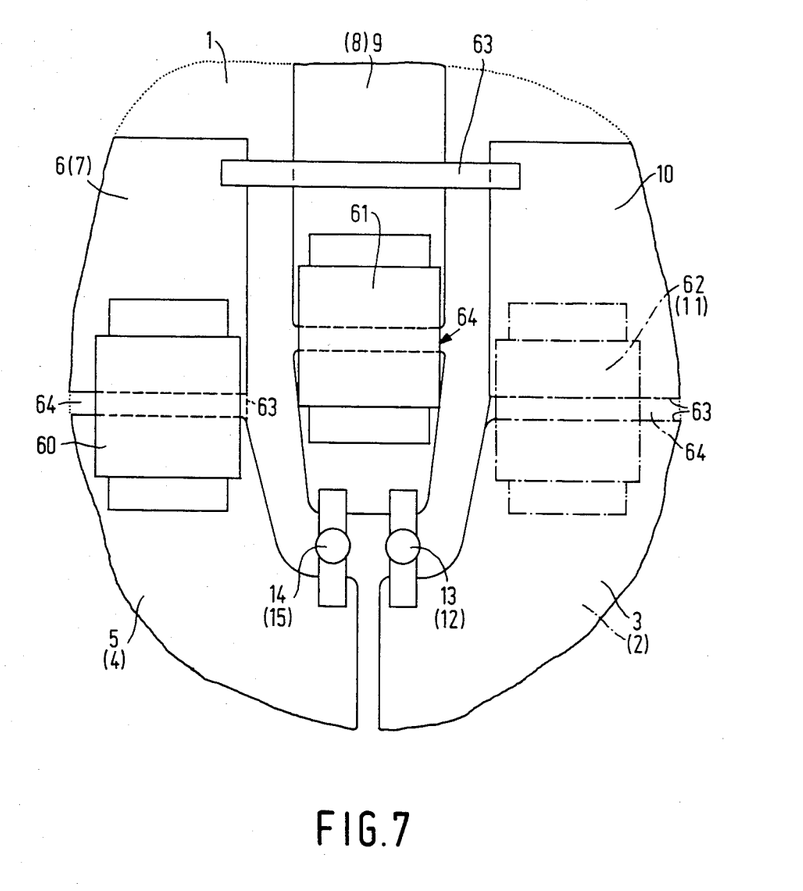
FIG. 7 shows a further embodiment of the invention in a top elevational view at the junction between the portion of the dielectric substrate comprising the waveguides.

FIG. 7 shows for a further embodiment of the invention a section from an elevational top view of the dielectric substrate 1. Provided on the upper surface of the dielectric substrate are the conductive layers 3, 5, 6, 9 and 10 and in registration therewith the conductive layers 2, 4, 7, 8 and 11 on the bottom side of the dielectric substrate 1. The dot-and-dash lines 63 indicate where the contours of the conductive layers at the bottom side deviate from those at the upper surface. In the positions denoted by 64 the conductive layers are interrupted so as to enable the application of separate d.c. biasing voltages to the mixing elements 12 to 15. These points of cut are shunted for high freuency by capacitors 60, 61 on the upper surface and capacitor 62 on the bottom side of the dielectric substrate 1. The capacitors are in the form of beam-lead components and are connected to the conductive layers by means of soldering, similar to the mixing elements 12 to 15.

The contours of the conductive layers 2 to 5 are rounded in the region of the mixing elements 12 to 15. This measure contributes to a reduction of current conduction losses.

A conductive bridge 63, for example made of gold wire, which interconnects the conductive layers 6 and 10 but which is insulated from the conductive layer 9 is added in the arrangement of FIG. 7. With such a bridge the waveform generated by the first waveguide on the second waveguide is short-circuited and consequently additionally attenuated. Moreover, it is possible to accomplish a further improvement of the match between the waveguides and the mixing elements 12 to 15.

What is claimed is:

1. A mixer comprising a plurality of bipolar mixing elements disposed at a junction of a plurality of waveguides, characterized in that said mixer includes:
   (a) a dielectric substrate having oppositely-disposed first and second sides;
   (b) a first waveguide comprising first and second spaced-apart conductive layers on the first side of the dielectric substrate, and corresponding substantially congruous conductive layers on the second side of said dielectric substrate;
   (c) a second waveguide comprising third and fourth spaced-apart conductive layers and a central conductive layer disposed therebetween, on the first side of the dielectric substrate, and corresponding substantially congruous conductive layers on the second side of said dielectric substrate; and
   (d) a third waveguide comprising an extended portion of the central conductive layer extending toward a slot defined by the first and second spaced-apart conductive layers, on the first side of the dielectric substrate, and a corresponding substantially congruous extended conductive layer portion on the second side of the dielectric substrate;
   said bipolar mixing elements including two mixing elements on the first side of the dielectric substrate electrically connecting the extended portion of the central conductive layer to the first and second spaced apart conductive layers, respectively, and two mixing elements on the second side of the dielectric substate correspondingly electrically connecting the corresponding conductive layers on said second side.

2. A mixer as in claim 1 where the third and fourth conductive layers comprise extended portions of the first and second conductive layers.

3. A mixer as in claim 1 where the dielectric substrate is disposed in an electrically conductive casing.

4. A mixer as in claim 3 where the casing is divided into two sections by the dielectric substrate, said substrate being secured between said sections by clamping.

5. A mixer as in claim 3 where an edge of each of the conductive layers is electrically connected to the casing.

6. A mixer as in claim 3 where at least one of the conductive layers is provided with a conductor which is electrically insulated from the casing, for applying a DC biasing voltage to at least one of the mixing elements.

7. A mixer as in claim 1 where the first waveguide comprises a slot transmission line and where the second waveguide comprises a coplanar transmission line.

8. A mixer as in claim 7 including an asymmetrical strip line coupled to the second waveguide, said asymmetrical strip line including an extended portion of the central conductive layer on the first side of the dielectric substrate which widens with distance from the second waveguide, and an extended portion of the corresponding central conductive layer on the second side of the dielectric substrate which does not substantially widen with distance from the second waveguide.

9. A mixer as in claim 8 where the asymmetrical strip line is electrically connected to a coaxial line, the non-widened conductive layer being electrically connected to a central conductor of the coaxial line, and the widened conductive layer being electrically connected to an outer conductor of the coaxial line.

10. A mixer as in claim 1 where the first waveguide comprises a fin transmission line and where the second waveguide comprises a coplanar transmission line.

11. A mixer as in claim 3, 7 or 10 where the first waveguide is coupled to a second rectangular hollow waveguide at a second junction formed by widening the slots defined by the respective conductive layers with distance from the mixing elements, said casing being in the form of a rectangular hollow waveguide at least in the region of the second junction.

12. A mixer as in claim 3, 7 or 10 where a space between the central conductive layer on the first side of the dielectric substrate and the corresponding conductive layer on the second side of the dielectric substrate increases with distance from the third waveguide to form a third junction coupled to a third rectangular hollow waveguide, and where the casing is in the form of a rectangular hollow waveguide at least in the region of the third junction.

13. A mixer as in claim 7, 10 or 6 where the central conductive layer on the first side of the dielectric substrate and the corresponding conductive layer on the second side of the dielectric substrate each include a discontinuity shunted by a coupling capacitor to enable the isolation of DC bias voltages appied to the mixing elements from any waveguides coupled to said conductive layers.

14. A mixer as in claim 13 where the mixing elements and the coupling capacitors are beam lead components.

15. A mixer as in claim 1 where the second waveguide is coupled to a rectangular hollow waveguide, said second waveguide being inserted as a rod in a central plane of the hollow waveguide which extends parallel to a smaller cross-sectional dimension of said hollow waveguide.

16. A mixer as in claim 15 where the third waveguide includes a cut-off filter disposed adjacent a side of the hollow waveguide which faces away from the mixing elements.

17. A mixer as in claim 16 where the cut-off filter comprises a section of a coplanar transmission line formed from conductive layers on the dielectric substrate.

18. A mixer as in claim 1 where the mixing elements have a nonlinear effective resistance.

19. A mixer as in claim 1 where the mixing elements have a nonlinear reactance.

20. A mixer as in claim 1 where the mixing elements comprise diodes.

21. A mixer as in claim 1 adapted for receiving via the first waveguide a signal having a frequency to be converted, for receiving via the second waveguide a pumping signal, and for providing via the third waveguide an intermediate frequency signal formed in the mixing elements.

* * * * *